United States Patent

Savkar et al.

[11] Patent Number: 5,127,364
[45] Date of Patent: Jul. 7, 1992

[54] APPARATUS FOR MAKING A-15 TYPE TAPE SUPERCONDUCTORS WHICH INCLUDES MEANS TO MELT A WIRE AT ITS TIP SO A BEAM IS FORMED AND MEANS FOR WIPING THE BEAD ONTO A CONTINUOUS TAPE SUBSTRATE

[75] Inventors: Sudhir D. Savkar, Schenectady; Carl M. Penney, Saratoga Springs, both of N.Y.

[73] Assignee: General Electric Company, Schenectady, N.Y.

[21] Appl. No.: 627,120

[22] Filed: Dec. 13, 1990

Related U.S. Application Data

[62] Division of Ser. No. 451,651, Dec. 18, 1989, abandoned.

[51] Int. Cl.⁵ .............................................. B05C 11/00
[52] U.S. Cl. .................................... 118/712; 118/620; 118/419; 427/531; 427/62; 148/DIG. 93
[58] Field of Search ............... 148/DIG. 93, DIG. 94; 118/620, 713, 665, 712, 670, 407, 419; 427/53.1, 62; 505/826, 912, 915, 916, 918; 219/121.16, 121.17; 164/463

[56] References Cited

U.S. PATENT DOCUMENTS

| | | | |
|---|---|---|---|
| 3,327,370 | 6/1967 | Cohen | 29/155.5 |
| 3,896,203 | 7/1975 | Maringer et al. | 264/165 |
| 3,952,180 | 4/1976 | Gnanamuthu | 219/121.65 |
| 4,088,512 | 5/1978 | Pickus et al. | 148/11.5 F |
| 4,358,473 | 11/1982 | DeBolt et al. | 118/665 |
| 4,422,403 | 12/1983 | Bostroem | 118/407 |
| 4,572,099 | 2/1986 | Michel et al. | 118/419 |

FOREIGN PATENT DOCUMENTS

| | | |
|---|---|---|
| 2108635 | 2/1971 | Fed. Rep. of Germany. |
| 1-212747 | 8/1989 | Japan. |

*Primary Examiner*—Michael Lusignan
*Assistant Examiner*—Benjamin L. Utech
*Attorney, Agent, or Firm*—James R. McDaniel; James C. Davis, Jr.; Paul R. Webb, II

[57] ABSTRACT

An apparatus for producing a tape superconductor of a compound superconductor type wherein the apparatus includes a first wire constructed of the superconducting compound material which is melted to form a bead. The bead is then wiped on a tape substrate to form a layer as the substrate is fed by the bead. Finally, the layer is cooled and a tape superconductor is formed.

11 Claims, 4 Drawing Sheets

Fig. 4

APPARATUS FOR MAKING A-15 TYPE TAPE SUPERCONDUCTORS WHICH INCLUDES MEANS TO MELT A WIRE AT ITS TIP SO A BEAM IS FORMED AND MEANS FOR WIPING THE BEAD ONTO A CONTINUOUS TAPE SUBSTRATE

This application is a division of application Ser. No. 07/451,651, filed Dec. 18, 1989, now abandoned.

BACKGROUND OF THE INVENTION

1. Field of the Invention

The present invention relates to a method and apparatus for producing superconductors in the form of an elongated tape.

2. Description of the Related Art

Although there is considerable technical and economic incentive to make superconducting magnets from A-15 type superconductors, especially from the so-called post-Niobium-Tin superconductors, e.g., Nb-Al, Nb-GE, Nb-Ga, this new class of superconductors have proven to be difficult to process into bundles of fine wire as had been the practice with superconducting compounds previously used, such as niobium-titanium. Further, attempts to date at making tape superconductors of the A-15 type have been successful in producing only short lengths of tape superconductors. Splicing such short lengths into longer, useful lengths of superconductor tape creates serious problems with the reliability of the conductor.

Perhaps the most common processes to date for forming A-15 type superconducting materials are plasma spray forming and the melt spinning. The former has the disadvantage that the conductors must be formed in relatively thick sections in order to ensure continuity of the superconductor material and of its superconductive properties. The melt spinning process has the disadvantage that there is a limitation on the amount of material which can be molten and ejected out under pressure to form a thin film on a substrate. The process is therefore not believed to be well suited for large scale production of superconductor products. Chemical vapor deposition (CVD) could be employed as well, but this process is slow and costly and also would not be well suited for large scale production.

Other processes disclosed in the art include forming a bulk "tape" of the superconducting material and heating and melting a center part of the tape such that the melted and resolidified section forms a compound superconductor region on the tape. The process has at least one disadvantage in that a much larger amount of the base material is required than is actually converted to the superconductive material. A further process disclosed in the art calls for forming a substrate of one of the elements of the compound superconductor and applying to the substrate a coating of a second element of the compound, heat treating the coated substrate to produce intermetallic compounds, and subsequently irradiating the coated substrate with a high-energy density beam such as an electron beam or laser beam. The process has the disadvantage that numerous process steps are required before the superconducting material is produced. Because both of these processes involve preparing a substrate for later processing, the processes will generally only be useful in producing superconductors of some finite length. Still other methods proposed in the art have similar drawbacks and provide further evidence of the difficulties in producing superconductor products using A-15 type compound superconductors.

It is therefore a principal object of the present invention to provide a simplified method for producing long lengths of superconductor tape.

It is another object of the present invention to provide a method for producing a superconductive tape of an A-15 type compound superconductor suitable for use in superconductor magnets. It is a further object of the present invention to provide a method for substantially continuous production of superconductive tape products of indeterminate length.

It is yet a further object of the present invention to provide a method for producing superconductor tape products which is especially well suited for on-line dimensional control and quality control of the tape product.

It is a further object of the present invention to provide an apparatus for producing elongated tape superconductors at speeds suitable for large scale production.

SUMMARY OF THE INVENTION

The above and other objects of the present invention are achieved in a method involving continuously melting the end of a wire feedstock made of a compound superconductor material, thereby forming a molten bead of the material at the tip of the wire, and passing a cooled tape substrate or backing material into contact with the molten bead to wipe the molten material onto the substrate. The wire feedstock is continuously advanced as the end is melted and wiped onto the substrate, and a film of the molten superconductor compound material is formed and resolidifies on e tape substrate, thus forming a superconductive tape product.

Laser heating of the wire feedstock is preferably employed to produce the molten bead at the end of the wire, although alternative approaches can be employed, such as generating an arc at the tip of a pair of wires in a manner similar to an arc welding process.

The process of the present invention may also be performed as a two step process, wherein a first film of one of the elements of the compound superconductor is laid down on the substrate and the second element is laid down on top of the first film. The thickness and continuity of the deposited films can be monitored and controlled using a laser tracking system. The tape may then optionally be heated to induce a diffusion reaction between the films of the two elements to produce the superconductor, either "on-line" with a subsequent heating device, or "off-line" at a later point in time.

The apparatus according to the present invention includes a means for melting a tip of the wire to produce a molten bead, a means for transporting a tape substrate of extended length in a predetermined direction with respect to the molten bead and into contact with the molten bead to wipe molten material from the bead onto the substrate to form a film of superconductor material, a means for continuously feeding the wire toward the substrate to me melted to replace molten material wiped from the bead, and a means for cooling the film to solidify the superconducting material.

BRIEF DESCRIPTION OF THE DRAWINGS

These and other features of the of the present invention and the attendant advantages will be readily apparent to those having ordinary skill in the art and the invention will be more easily understood from the following detailed description of the preferred embodiments of the present invention taken in conjunction with the accompanying drawings wherein like reference characters represent like parts throughout the several views, and wherein.

DETAILED DESCRIPTION OF THE INVENTION

Figure 1:
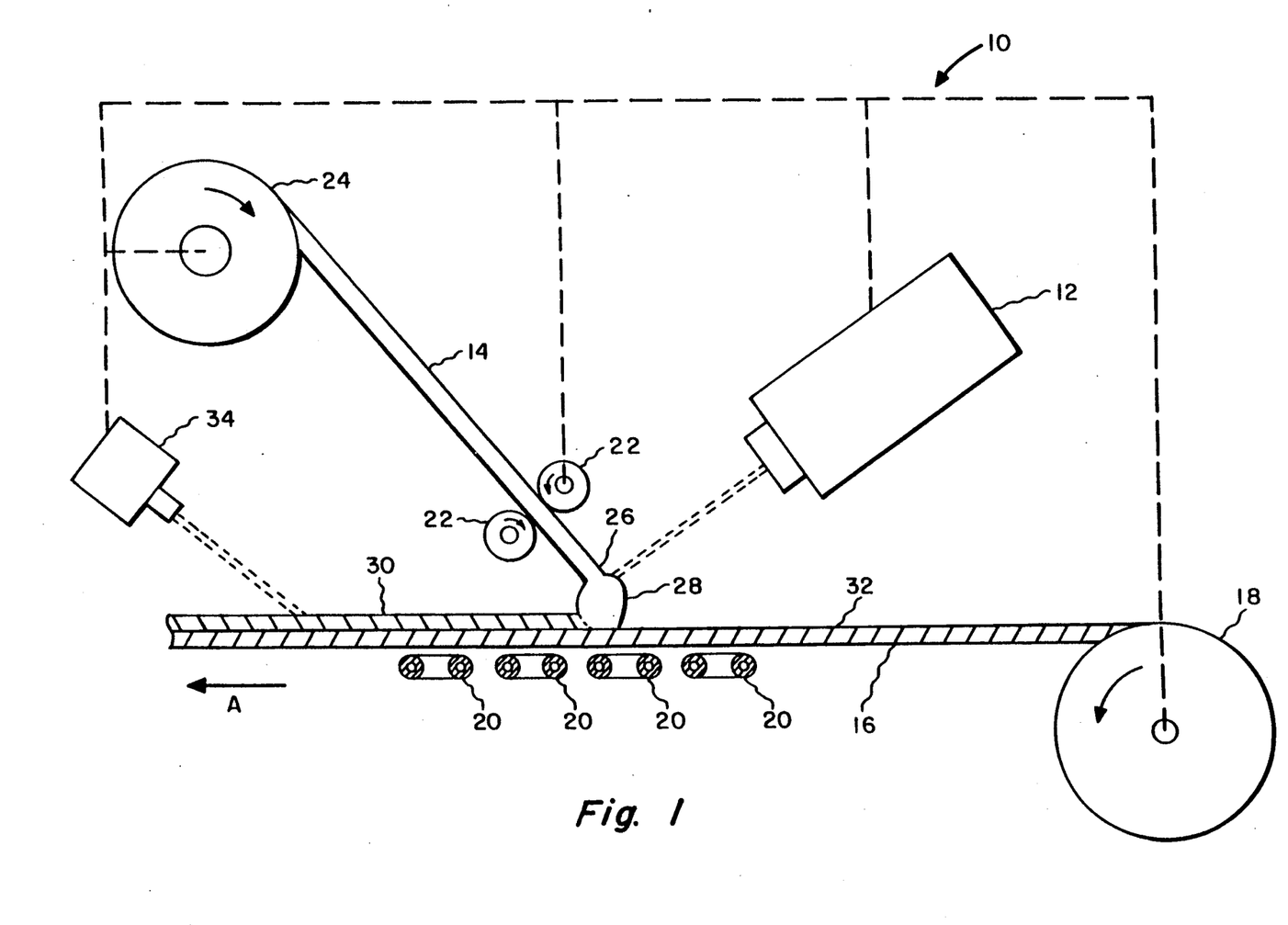
FIG. 1 is a side view of an apparatus used in practicing the method of producing a tape superconductor in accordance with a preferred embodiment of the present invention.

Referring initially to FIG. 1, an apparatus 10 for producing tape superconductors according to the method of the present invention is depicted. A high powered laser heat source 12 of a type known generally in the art is positioned such that the laser beam is directed at the tip of a wire 14 which, in this embodiment, is made up of the superconductor compound material. The apparatus and method of the present invention are particularly well suited for use with A-15 type superconductors, e.g. Nb-Al, Nb-Ge, Nb-Ga and Nb-Sn, although other superconductor materials may be employed in producing tape superconductors.

One potentially significant advantage found in the method of the present invention is that the method may be carried out without the necessity of employing a vacuum chamber or otherwise drawing a vacuum in any part of the process. It is expected that the method will preferably be carried out in a controlled air or inert gas environment, either of which provides relative simplicity of operation as compared to the use of a vacuum chamber which other of the known processes employ.

A cooled substrate or backing material 16, such as copper, is disposed to pass in close proximity to the tip of the superconductor wire 14 when the substrate is moved horizontally and axially in a direction along a longitudinal axis of the apparatus, as indicated by arrow A, past the tip of the wire. The tape substrate may be supplied in any conventional manner, shown in FIG. 1 as being unwound from supply roll 18. The cooling of the substrate may be accomplished in a conventional manner, by passing the substrate through a refrigeration unit or chill rolls ahead of the point where the superconductor wire 14 is located, or may be cooled from underneath by coils 20, as depicted substantially schematically in FIG. 1. Substrate 16 is chilled in order to prevent the possibility that the substrate will melt when the film is deposited thereon, and also to effect a rapid quench and solidification of the film, and therefore the means for chilling the substrate is preferably designed to chill the substrate both immediately before the molten material is deposited, and immediately thereafter.

The superconductor wire 14 is continuously fed in a direction toward substrate 16, passing between roller guides 22 at a location above the substrate and above the tip area of the wire irradiated by the laser beam, in order to support the wire and maintain the position of the wire tip at a substantially constant location. The wire feed system may be of a type used in consumable electrode arc welding processes, indicated substantially schematically by spool 24 from which the wire is fed. Roller guides 22 and/or spool 24 may be driven in order to feed the wire toward the substrate.

In this preferred embodiment of the method of the present invention, the laser heat source 12 directs a laser beam with substantial power at the tip 26 of the superconductor wire 14, which melts the wire material to form a molten bead 28 of the superconducting material. A suitable laser source could be a commercially available $CO_2$ laser with a power output capability which, depending upon several factors including the speed at which the process is carried out, would be about 50W minimum to about 1000W maximum. The substrate 16 is positioned to be in contact with this molten bead 28, and as the substrate is moved laterally with respect to the bead, molten material is wiped onto the substrate to form a superconductor film 30 on a top surface 32 of the substrate 16. The speed of travel of the substrate and of the wire feed are preferably coordinated such that the wire 14 is continuously fed toward the substrate and melted by the laser heat source to continuously replenish the molten bead, with the bead formed at the tip of the wire being wiped onto the substrate to produce a continuous film of a predetermined thickness. Stated another way, it is preferred in the present apparatus and method to maintain the molten bead at a substantially constant volume as the process takes place. The thickness of the deposited film may preferably range from about ⅓ mil to about 2 mils, although other thicknesses may prove to be suitable in various applications.

Because the substrate is cooled in this preferred embodiment, the molten superconductor material is quickly quenched and solidified once the material exits the area heated by laser 12. The finished product, comprising the substrate and the superconductive film disposed thereon can be made in long, substantially continuous lengths, the length being theoretically limited only by the length of the tape substrate starter material and/or the upper limit of the length of a wire feedstock which can be continuously supplied by the wire feed system.

The upper surface 32 of the tape substrate 16 may optionally be treated in order to improve the wettability of the substrate which will have the effect of improving the bonding of the superconductive film thereto. Examples of such treatments would be an acid cleaning of the surface or other treatments to remove oxides therefrom, or a physical roughening of the surface.

The method of the present invention lends itself well to on-line control, whether automatic or manual, in obtaining a tape having desired dimensions, especially a thickness dimension, and also having a desired level of deposit continuity and quality. A laser tracking system, shown schematically at 34, similar in pertinent respect to arc bead laser tracking system previously developed for use in arc welding processes, is especially well suited for monitoring and controlling the thickness and deposit continuity (quality) of the superconductor material deposited on the tape. It will be readily recognized that both the wire feed rate and the speed of travel of the substrate could be varied, as well as the melting of the wire, in controlling the thickness of the deposited film. Increasing the speed of travel of the tape substrate would have a tendency to result in a thinner superconductive film layer, as would a reduction in the wire feed rate and in the melting of the wire. Conversely, a decrease in e speed of travel of the tape substrate or an increase in the wire feed rate (assuming that the laser has sufficient power to completely melt the tip of the wire at such a rate) would tend to have the effect of increasing the resulting thickness of the superconductive film.

As indicated previously, a preferred thickness for the deposited material may be selected in a range from about ½ mil to 2 mils. The laser tracking system 34 will thus preferably contain process control hardware and/or software and will preferably be operatively coupled to the various components responsible for the substrate supply rate, the wire feed rate and the power output of the laser heat source, as indicated by broken lines in FIG. 1. Other monitoring and control means previously employed in the art may be used in performing these functions as well.

Figure 2:
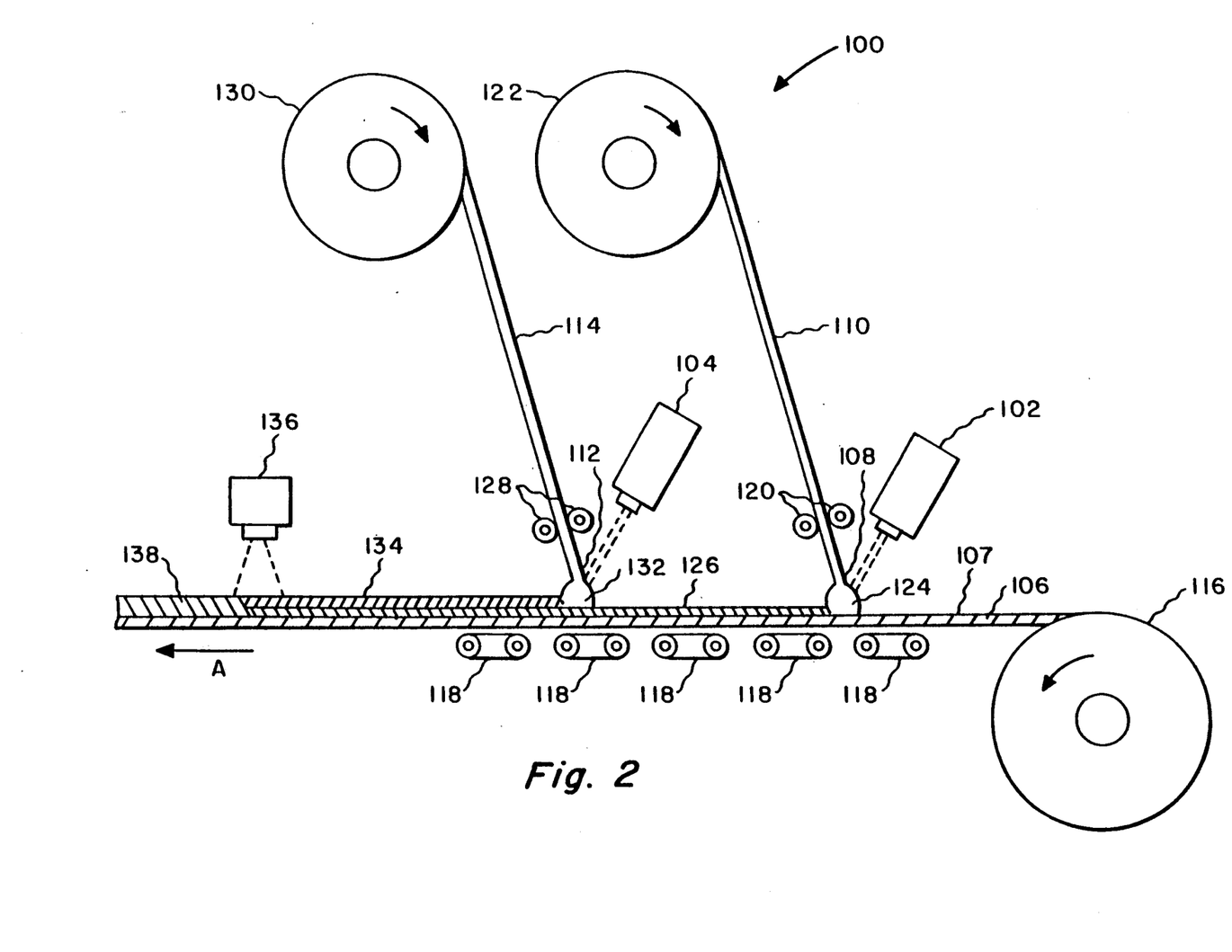
FIG. 2 is a side view of an apparatus used in practicing an alternate preferred version of the method of the present invention.

FIG. 2 depicts an apparatus 100 which may be employed to perform the method described above, or, where desired, a variation of that method. Except where indicated to the contrary, the components depicted in FIG. 2 will preferably have the same operating characteristics as the analogous components depicted and described with respect to claim 1. The apparatus in this embodiment comprises a first and a second laser heat source 102, 104, respectively, of a type known generally in the art. The laser heat sources 102, 104 are spaced apart from one another with respect to an axial direction of travel A of tape substrate 106. The first laser heat source is positioned to direct a laser beam at the tip 108 of a first wire 110 made up of a first element from which the compound superconductor is to be formed.

The second laser heat source 104 is positioned "downstream" of first laser heat source 102, the downstream direction being determined by the direction of travel A of the substrate. The second laser heat source is positioned to direct a laser beam at the tip 112 of a second wire 114 made up of a second element from which the compound superconductor is to be formed.

The tape substrate or backing material 106 is preferably cooled in a manner similar to the FIG. 1 embodiment, and is disposed to pass in close proximity to the tips 108, 112 of the first and second superconductor wires 110, 114, when the substrate is moved horizontally, as indicated by arrow A, past the tips of the wires. As in the FIG. 1 embodiment, substrate 106 may be supplied from a supply roll 116, or other conventional means, and the cooling of the substrate can be accomplished through the use of cooling coils 118.

The first wire 110 is continuously fed in a direction toward substrate 106, passing between roller guides 120 at a location above the substrate and above the tip area of the wire which is to be irradiated by the laser beam. The roller guides are provided in order to support the wire and maintain the position of the wire tip at a substantially constant location. The wire feed system, represented by spool 122, may be of a type used in conventional arc welding processes as discussed above with respect to FIG. 1.

The first laser heat source 102 directs a high energy laser beam at the tip 108 of the first wire 110, which heats and melts the wire material, thus forming first molten bead 124. As in the FIG. 1 apparatus, substrate 106 is positioned to be in contact with the molten bead 124, and as the substrate is moved laterally with respect to me bead, molten material from the bead is continuously wiped from the wire onto substrate 106 to form a first film 126 on the upper surface 107 of the substrate, in a manner substantially identical to the method in FIG. 1.

The second wire 114 is continuously fed toward substrate 106, passing between roller guides 128 at a location above the substrate 106 and first deposited film 126 and above the tip area of the wire which is to be irradiated by the second laser beam. The wire feed system which his preferably identical to that previously described, is represented by spool 130.

The second laser heat source 104 directs a high energy laser beam at the tip of 112 of second wire 114, which heats and melts the wire material, thus forming second molten bead 132. Molten material from the second molten bead is continuously wiped from the wire onto the first film 126, which forms a second film layer 134 disposed on top of first film 126.

The two wires 110, 114, and thus the two film layers 126, 134, in this embodiment preferably comprise the two elements from which the compound superconductor is formed. For example, in producing a niobium-tin compound superconductor, the first wire used to lay down the first film 126 may comprise niobium (Nb), and the second wire, forming second film 134, would comprise tin (Sn). Superconductive properties are attained in such a structure by diffusion of a sufficient quantity of the tin into the niobium such that an $Nb_3Sn$ (A-15 type) phase is formed. In this "two step" process described with respect to FIG. 2, it may be possible to achieve an adequate level of diffusion without further processing, particularly if the second film is deposited in its molten state on a first film which has not been fully quenched.

While it is generally recognized that, in order to obtain adequate levels of diffusion with the materials of interest herein, the materials must be held at a minimum temperature at least one-half of the melting temperature of the material having the higher melting temperature. In the tape superconductor described as an example above, i.e., a niobium-tin superconductor on a copper backing or substrate, the diffusion must take place at a temperature lower than one-half of the melting temperature of niobium (2700° C.), as the copper would melt at that temperature. However, a sufficient amount of diffusion may be obtained by slowing the quench rate of the first film 126 deposited on the substrate, and by holding the temperature for a slightly longer time period.

Alternatively, if it is desired to augment the diffusion occurring at the time the second film is deposited, a further reaction between the films may be carried out "on-line" by a further heating device, such as a plasma arc torch 136, of a type known generally in the art. In the example above, the torch 136 may preferably be designed to heat the tape to approximately 900° C., which is roughly 15% cooler than the melting temperature of the copper substrate. The temperature and duration of additional heating can be selected to ensure adequate diffusion of the tin into the niobium, as indicated schematically in FIG. 2 showing a single superconductor film 138 disposed on substrate 106 resulting from the heating and diffusion, even though in reality a complete diffusion of the element is not likely to be actually achieved. The further reaction, where necessary or desirable, may optionally be conducted "off-line", as is done in other processes known in the art.

It is to be recognized that the above method may be practiced with any of the other A-15 type compound superconductors or other compound superconductors in a similar manner. Likewise, the order in which the films are deposited is not believed to be critical to the method, and therefore the secondary element (e.g., Ga, Ge, Al, Sn) may be deposited at the first film, with the niobium being deposited as the second film.

As with the "one-step" process described with respect to FIG. 1, the thickness and continuity of the films deposited on the tape substrate 106 can be monitored and controlled using a laser tracking system operatively coupled with the tape substrate and wire feed speed controls.

Figure 3:
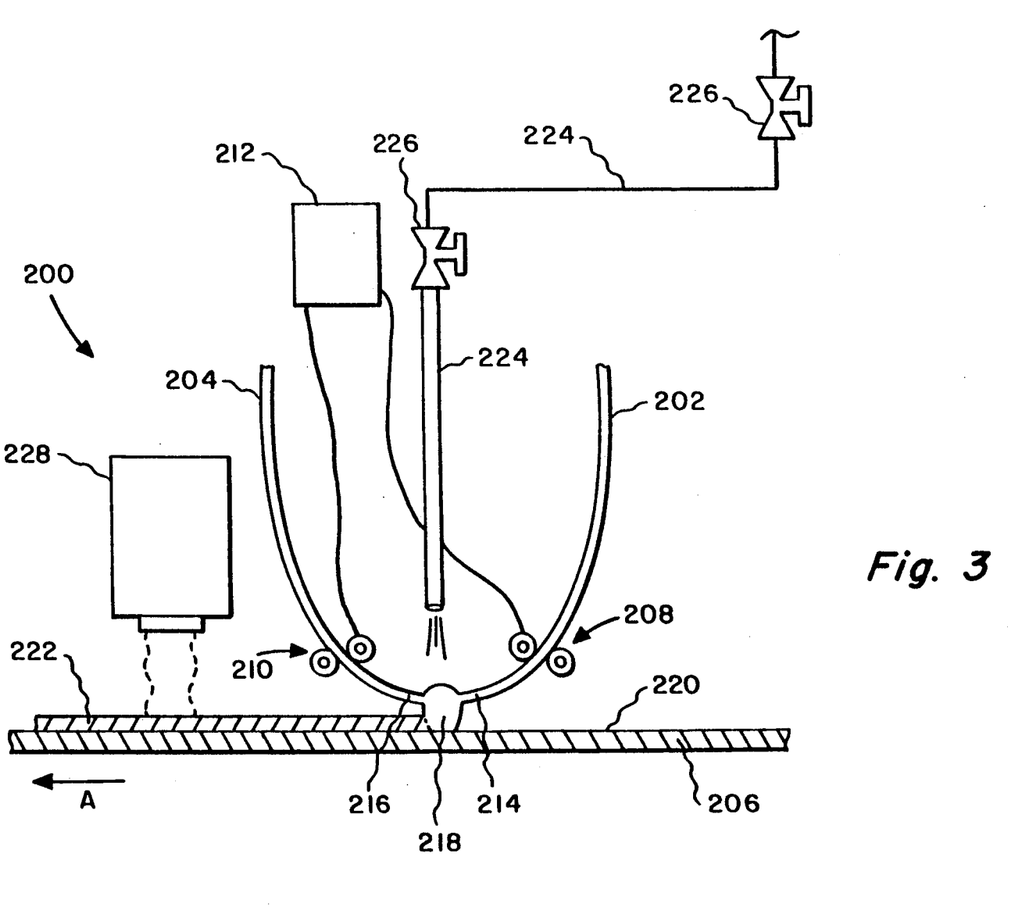
FIG. 3 is a substantially schematic representation of an alternate apparatus which may be used in practicing the method of the present invention.

FIG. 3 depicts, in substantially schematic form, an alternative apparatus 200 for producing tape superconductors according to the method of the present invention. This apparatus 200 employs a different means for generating a molten bead of material than those depicted in FIGS. 1 and 2. In this embodiment, an arc is created at the tips of a first and a second superconductor wire 202, 204, respectively, which are fed to a predetermined location immediately above the moving substrate 206.

As in FIGS. 1 and 2, the direction of movement of the substrate is indicated by arrow A, and the substrate 206 may be supplied by any conventional means including a supply roll as depicted in either FIG. 1 or FIG. 2. The first and second wires 202, 204 are likewise continuously supplied in a conventional manner such as a wire spool like those depicted in FIGS. 1 and 2.

In this embodiment, a first and second pair of roller guides 208, 210, associated with the first and second wires 202, 204, act not only to feed and guide the wires to the desired location, but also preferably serve as electrodes to feed current through the wires in a manner similar to conventional DC arc welding process. A conventional DC arc power supply 212 is connected to each of these pairs of roller guides 208, 210, to provide a current running through each of the first and second wires.

The first and second wires 202, 204 are both fed to the same predetermined location, and an arc is struck between the tips 214, 216 of the current-carrying wires, thereby forming a molten bead 218 comprising material melted from the tips of each of the two wires. The moving substrate 206 is positioned, as in FIG. 1 to come into contact with the molten bead 218, and to wipe molten material onto an upper surface 220 of the substrate to form a film 222 which is subsequently quenched to form an elongated superconductive film or tape on tape substrate 206.

The moving substrate 206 is preferably cooled or chilled (cooling means not shown) in a manner similar to the substrates of FIGS. 1 and 2, in order to prevent possible melting of the substrate and to promote a rapid quench of the deposited film. In addition, the FIG. 3 apparatus further includes a means for delivering a cooling gas at the upper side of the molten bead 218 formed in the method described above. The cooling gas may be delivered through schematically depicted conventional tubing 224, in line with one or more valves 226 provided, as necessary, to control the flow rate of the cooling gas or to completely shut off the flow of cooling gas in instances where in is not desired. The flow of cooling gas may improve the process and the quality of the film deposits and tape superconductors produced in that the cooling gas will force the molten bead 218 downwardly toward the substrate, and in addition will assist in quenching the deposited film 222.

The first and second wires 202, 204 are preferably each made of the desired superconductor compound material, whether of the A-15 type or other superconductor compositions. Alternatively, it may be possible to employ as wire feedstock a first wire 202 comprising a first element of the compound superconductor and a second wire 204 comprising the second element of the compound superconductor. For example, a niobium wire and an aluminum wire may be used in the process as first and second wires 202, 204, respectively, and the superconductive compound phase $Nb_3Al$ would have an opportunity form in solution in the molten bead and subsequently be deposited on the substrate 206.

FIG. 3 also depicts a plasma arc torch 228 located downstream of the area in which the molten bead is deposited on the substrate to form film 222. The plasma arc torch is employed, as in FIG. 2, to heat the deposited film to promote the diffusion of the elements comprising the compound superconductor. This further heating of the film may not be necessary in all instances as adequate diffusion of the elements may be achieved at the time the film is deposited and before the deposited film 222 has been quenched. Also, it would be possible, if further diffusion of the elements is desired, to carry out an "off-line" diffusion reaction process in lieu of the "on-line" process represented by plasma arc torch 228.

Figure 4:
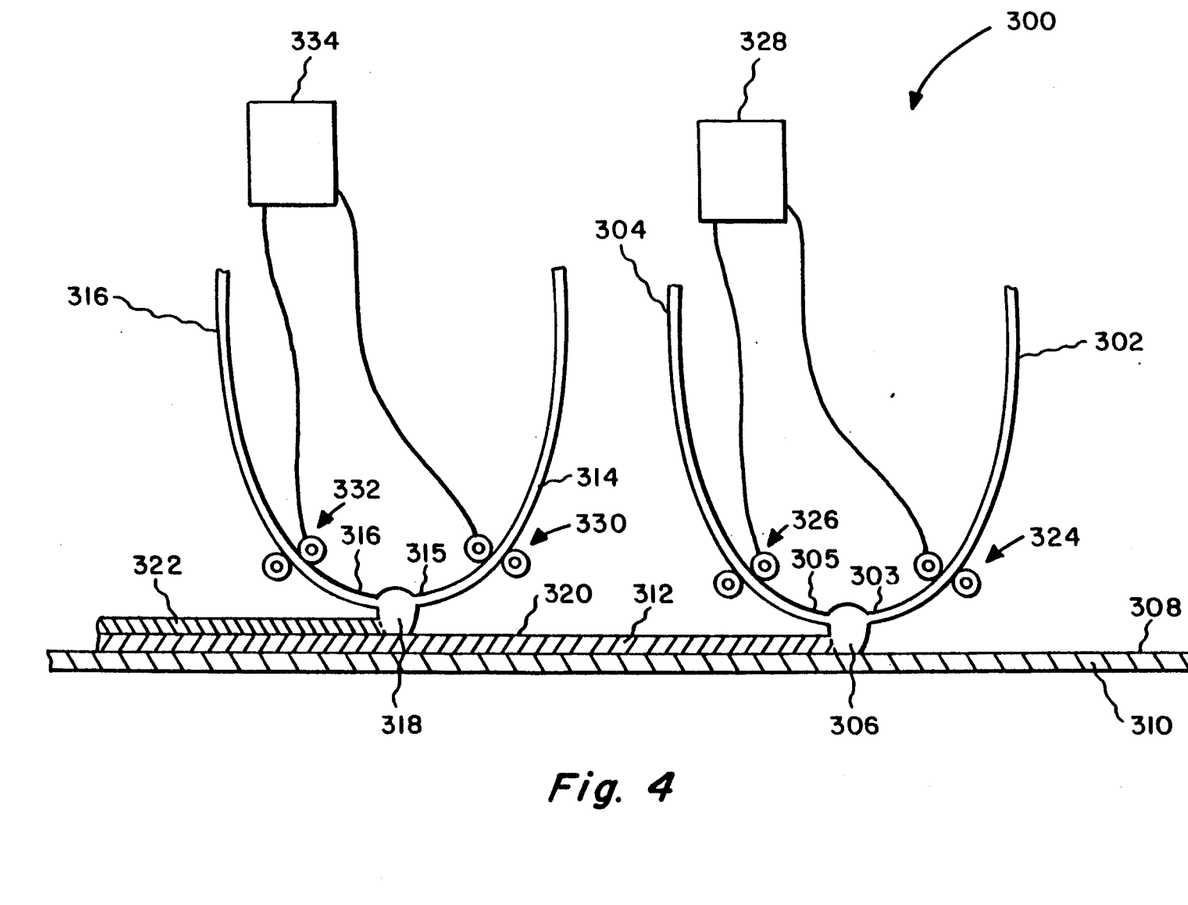
FIG. 4 is a further substantially schematic representation of an alternate apparatus which may be used in practicing the method of the present invention.

FIG. 4 depicts, in substantially schematic form, a further alternative apparatus 300 for producing tape superconductors according to the method of the present invention. The apparatus in this Figure is used to perform a "two-step" film deposition process similar in many respects to the process described with respect to FIG. 2. For example, the wire feed means and the substrate supply means may preferably be of the same type as those previously described.

In this embodiment, an arc is struck between a first pair of continuously fed first and second wires 302, 304, at the wire tips 303, 305, forming first molten bead 306, which is wiped onto an upper surface 308 of moving tape substrate 310. Downstream of the formation of first film 312, an arc is struck between a second pair of continuously fed first and second wires 314, 316, at the wire tips 315, 317, forming second molten bead 318, which is wiped onto an upper surface 320 of first film 312, thus forming second film 322.

The means for striking the arcs in the FIG. 4 embodiment may preferably be similar to that described with respect to FIG. 3. A first and second pair of roller guides 324, 326 is provided to guide the first pair of first and second wires 302, 304, to the desired predetermined position above substrate 310, and the roller guides 324, 326 are coupled to a first DC arc power supply 328, and serve as electrodes for delivering current through the wire to create the arc. An additional or second pair of first and second roller guides 330, 332 is provided to guide the second pair of first and second wires 314, 316 to the desired predetermined position above first film 312, and the roller guides 330, 332 are coupled to a second DC arc power supply 334, and serve as electrodes for delivering current through the wire to create the arc. Although not shown in FIG. 4, it is to be understood that a cooling gas may preferably be delivered blowing downwardly on each of first and second molten beads 306, 318, in a manner identical to that described with respect to FIG. 3.

In an example in which this embodiment is employed to produce an A-15 type compound superconductor the first pair of first and second wires 302, 304 may comprise niobium or a basic alloy containing niobium, and each of the second pair of first and second wires 314, 316 may preferably comprise the second element (Al, Ga, Ge, Sn) or an alloy of the second element and niobium. The film deposition process itself may, under appropriate circumstances, provide adequate diffusion of the elements in the first and second films in order to produce the compound superconductive material. However, as with the embodiments discussed with respect to FIGS. 1-3, an "on-line" or "off-line" heating of the tape and deposited films to produce further diffusion of the elements may be employed where desired or if required.

It is to be understood and recognized that the foregoing detailed description of the invention is given merely by way of illustration, and many modifications and variations will be apparent to those skilled in the art without departing from the spirit or scope of the present invention. Therefore, the scope of the invention is to be determined by reference to the appended claims.

What is claimed is:

1. Apparatus for producing a tape superconductor of a metallic A-15 superconductor type comprising:
    a first wire substantially constructed of a superconducting compound material;
    means for melting said first wire at a tip thereof to form a first molten bead at said tip;
    means for transporting a tape substrate of continuous length in a predetermined direction relative to said tip of said first wire, said substrate being transported into contact with and axially past said first molten bead formed at said tip of said first wire, wherein molten material from said first molten bead is wiped onto an upper surface of said tape substrate to form a first film thereon;
    means for substantially continuously feeding said first wire as said tip of said first wire is progressively melted by said melting means and wiped onto said substrate
    means for cooling said substrate when said substrate is transported into contact with and past said first molten bead wherein said first film is rapidly quenched; and
    means for monitoring said first film deposited on said substrate and means for controlling a thickness of said film deposited coupled to said monitoring means and coupled to at least one of said melting means, transporting means and wire feeding means.

2. Apparatus as defined in claim 1 wherein said melting means comprises a laser heat source having sufficient power output to melt said first wire.

3. Apparatus as defined in claim 1 wherein said monitoring means comprises a laser tracking system.

4. Apparatus as defined in claim 1 wherein said first wire consists essentially of a first element of a two element metallic A-15 type superconductor, and said apparatus further comprises:
    means for melting a second wire at a tip thereof to form a second molten bead at said tip, wherein said second wire consists essentially of a second element of said two or more element superconductor, and wherein said transporting means is so constructed and arranged to transport said substrate and said first film into contact with and axially past said second molten bead formed at said tip of said second wire, wherein molten material from said second molten bead is wiped onto an upper surface of said first film to form a second film thereon;
    means for substantially continuously feeding said second wire as said tip of said second wire is progressively melted by said melting means and wiped onto said first film; and
    means for cooling said substrate when said substrate is transported past said second molten bead.

5. Apparatus as defined in claim 4 further comprising means for heating said first and said second films disposed on said substrate to a temperature and for a time sufficient to induce diffusion of elements between said first and second films as said substrate is transported.

6. Apparatus as defined in claim 1 wherein said melting means further comprises means for generating an arc between said tip of said first wire and a tip of a second wire, said first and second wires forming a first pair of wires, to form said first molten bead at said tips; and
    means for substantially continuously feeding said second wire of said first pair of wires as said first molten bead is progressively wiped onto said tape substrate.

7. Apparatus as defined in claim 6 wherein said means for generating said arc comprises a DC power supply conductively coupled to said first and second wires of said first pair of wires.

8. Apparatus as defined in claim 7 further comprising means for generating an arc between a tip of a first and second wires of a second pair of wires to form a second molten bead at said tips, wherein said transporting means is so constructed and arranged to transport said substrate and said first film into contact with and axially past said second molten bead formed at said tips of said second pair of wires, wherein molten material from said second molten bead is wiped onto an upper surface of said first film to form a second film thereon;
    means for substantially continuously feeding said first and second wires of said second pair of wires as said second molten bead is progressively wiped onto said first film; and
    means for cooling said substrate when said substrate is transported past said second molten bead.

9. Apparatus as defined in claim 8 wherein said first and second wires of said first pair of wires comprises a first element of a two element metallic A-15 superconductor and said first and second wires of said second pair of wires comprise a second element of said two element superconductor.

10. Apparatus as defined in claim 7 further comprising means for supplying a cooling gas to an upper side of said first molten bead.

11. Apparatus as defined in claim 8 further comprising means for supplying a cooling gas to an upper side of said first molten bead and to an upper side of said second molten bead.

* * * * *

UNITED STATES PATENT AND TRADEMARK OFFICE
CERTIFICATE OF CORRECTION

PATENT NO. : 5,127,364

DATED : July 7, 1992

INVENTOR(S) : Sudhir D. Savkar and Carl M. Penney

It is certified that error appears in the above-identified patent and that said Letters Patent is hereby corrected as shown below:

On the title page, item (54) should read:

--APPARATUS FOR MAKING AN A-15 TYPE TAPE SUPERCONDUCTOR WHICH INCLUDES MEANS TO MELT A WIRE AT ITS TIP SO A BEAD IS FORMED AND MEANS FOR WIPING THE BEAD ONTO A CONTINUOUS TAPE SUBSTRATE--

In column 1, lines 2-6, cancel the existing title and substitute the following title to take its place:

--APPARATUS FOR MAKING AN A-15 TYPE TAPE SUPERCONDUCTOR WHICH INCLUDES MEANS TO MELT A WIRE AT ITS TIP SO A BEAD IS FORMED AND MEANS FOR WIPING THE BEAD ONTO A CONTINUOUS TAPE SUBSTRATE--

Signed and Sealed this

Seventh Day of September, 1993

Attest:

BRUCE LEHMAN

*Attesting Officer*   *Commissioner of Patents and Trademarks*